United States Patent
Mejia et al.

(10) Patent No.: US 7,057,895 B2
(45) Date of Patent: Jun. 6, 2006

(54) THERMAL STANDOFF FOR CLOSE PROXIMITY THERMAL MANAGEMENT

(75) Inventors: Charles G. Mejia, Portland, OR (US); Bahman Moallem, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 10/611,110

(22) Filed: Jun. 30, 2003

(65) Prior Publication Data

US 2004/0264142 A1 Dec. 30, 2004

(51) Int. Cl.
*H05K 7/20* (2006.01)

(52) U.S. Cl. .................. 361/700; 165/80.3; 165/104.33; 165/185; 174/15.2; 174/138 G; 174/138 D; 361/710; 361/719; 361/720

(58) Field of Classification Search ....... 165/80.2–80.3, 165/104.33, 185; 174/15.2, 138 G, 138 D; 361/687, 742, 802–804, 700–721, 758, 770, 361/699, 760
See application file for complete search history.

(56) References Cited

U.S. PATENT DOCUMENTS

| | | | | |
|---|---|---|---|---|
| 4,004,195 A | * | 1/1977 | Harayda et al. | 361/710 |
| 5,285,352 A | * | 2/1994 | Pastore et al. | 361/707 |
| 6,002,588 A | * | 12/1999 | Vos et al. | 361/708 |
| 6,349,033 B1 | * | 2/2002 | Dubin et al. | 361/704 |
| 6,356,448 B1 | * | 3/2002 | DiBene et al. | 361/721 |
| 6,452,804 B1 | * | 9/2002 | Dibene et al. | 361/720 |
| 6,493,233 B1 | * | 12/2002 | De Lorenzo et al. | 361/752 |
| 6,535,386 B1 | * | 3/2003 | Sathe et al. | 361/700 |
| 6,674,643 B1 | * | 1/2004 | Centola et al. | 361/720 |
| 6,762,944 B1 | * | 7/2004 | Mizusaki | 361/804 |

* cited by examiner

*Primary Examiner*—Gregory Thompson
(74) *Attorney, Agent, or Firm*—Blakely, Sokoloff, Taylor and Zafman

(57) ABSTRACT

A thermal management system is described for cooling an electronic component mounted on a printed circuit board. The thermal management system includes a heat sink coupled to an electronic component generating heat on a primary side of the printed circuit board and a cooling structure coupled to a secondary side of the printed circuit board. The thermal management system further includes a heat transfer element to transfer heat from the heat sink to the cooling structure. The heat transfer element is routed through the printed circuit board to establish thermal connection between the heat sink and the cooling structure.

21 Claims, 1 Drawing Sheet

THERMAL STANDOFF FOR CLOSE PROXIMITY THERMAL MANAGEMENT

BACKGROUND

1. Field

Embodiments relate to the field of dissipating heat generated by an electronic component mounted on a printed board assembly.

2. Background

Electronic devices, such as servers, personal computers, portable computers, and electronic equipment, typically include a chassis (e.g., device housing) containing one more printed board assemblies. In general, integrated circuits mounted on printed board assemblies continue to consume more power with increasing capabilities, resulting in increasing amount of heat generated from these components.

As requirements of electronic components continue to increase, in some instances, heat sinks alone are not capable of achieving the desired heat dissipation. Accordingly, in conventional systems, thermal management is often accomplished with a heat sink in combination with a cooling fan either mounted directly over the heat sink or off to the side. However, there are a number of disadvantages associated with a heat sink and fan combination that are often bulky and relatively tall. First, relatively tall heat sink and fan combinations drive the overall system height which is inconsistent with desires for lower profile systems. Additionally, certain amounts of area on the board are forfeited in order to accommodate retention mechanisms used to secure the heat sink and fan combinations on circuit boards. Moreover, the heat sink and fan combinations mounted on printed circuit boards can be relatively heavy. The weight of the heat sink and fan will cause stress when shock or vibration is applied to the circuit board, potentially causing damage to the solder connections.

Furthermore, as the number of components on a printed board assembly that require thermal management continues to increase, multiple heat sink and fan combinations may be required to effectively dissipate heat from the circuit board. In such cases, these thermal solutions can block airflow from the system fan, preventing it from reaching components that are farther away. Because of practical limitations on physical size of the chassis and the circuit boards, limited number of heat sink and fan combinations can be utilized within the same device housing to dissipate heat from the high temperature components.

BRIEF DESCRIPTION OF THE DRAWINGS

Embodiments may best be understood by referring to the following description and accompanying drawings, in which.

DETAILED DESCRIPTION

In the following description, for purposes of explanation, specific details are set forth to provide a thorough understanding of embodiments of the present invention. However, it is understood that embodiments may be practiced without these specific details. In other instances, well-known structures and techniques have not been shown in detail to avoid obscuring the understanding of this description.

Figure 1:
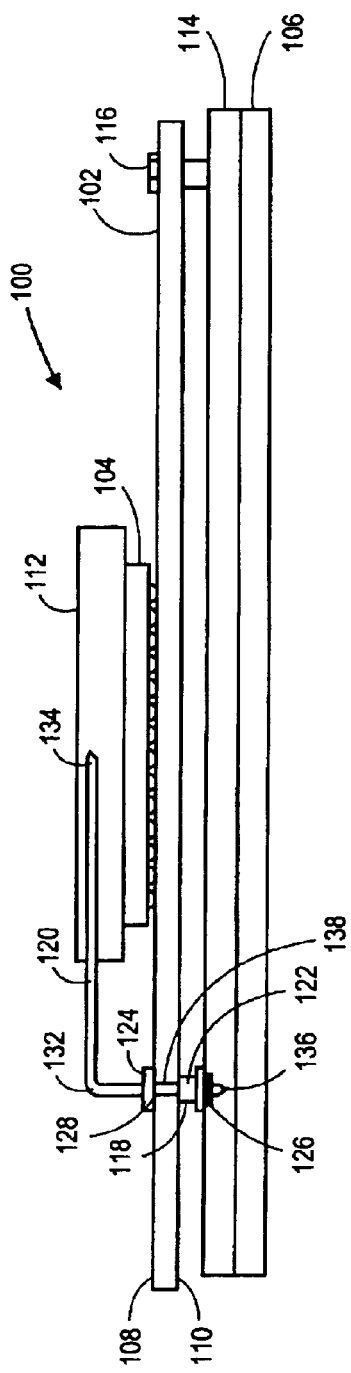
FIG. 1 is a sectional side view illustrating a thermal management system in accordance with one embodiment of the present invention.

FIG. 1 shows a thermal management system 100 in accordance with one embodiment of the present invention. The thermal management system 100 is incorporated within a printed board assembly 102 (also referred herein as "printed circuit board") to dissipate heat from one or more electronic components 104 mounted thereon. The printed circuit board 102 may be contained within an electronic device, such as a server, personal computer, portable computer, or other electronic equipment.

The printed circuit board 102 typically has two sides. The side that has most of components mounted thereon is commonly referred to as a primary side 108 and the other side is commonly referred to as a secondary side 110. The primary side 108 of the printed circuit board may be mounted with circuit components such as one or more processors, a variety of memory elements, a chipset, an expansion slot, voltage regulators, input/output controller hub, memory controller hub, and other components.

As shown in FIG. 1, the thermal management system 100 includes a heat sink 112 that is coupled to an electronic component 104, such as a processor, generating heat on the primary side 108 of the printed circuit board. The heat sink 112 is any thermally conductive structure attached to an electronic component that conducts the heat away from the attached component. The heat sink 112 may be attached to the electronic component 104 using any securing mechanism, including use of adhesive, clips or other retention mechanisms that secures the heat sink on top of and in direct contact with the electronic component. Thermally conductive material may be applied between the surfaces of the heat sink and the electronic component to ensure a good thermal connection between the two structures.

In accordance with one embodiment, the thermal management system 100 takes advantage of the space available underneath the printed circuit board, between the board 102 and the chassis 106 to accommodate a cooling structure 114 that can be shared among multiple high temperature components. The cooling structure 114 is coupled to the printed circuit board 102 using a number of circuit board mounting mechanisms, such as circuit board mounting standoffs 116, and thermal standoffs 118. The standoffs 116, 118 are configured to mount the circuit board 102 in a spaced relation with the cooling structure 114.

The thermal management system 100 further includes a heat transfer element 120 coupled to transfer heat from the heat sink 112 to the cooling structure 114. In the illustrated embodiment, the heat transfer element 120 extends from the heat sink 112 mounted on the primary side 108 of the printed circuit board 102 and is routed through the printed circuit board to terminate in the cooling structure 114 located on the other side of the printed circuit board.

In one embodiment, the heat transfer element 120 is embodied in the form of a heat pipe having a capillary wick structure provided along the inside wall of the heat pipe. Both ends of the heat pipe 120 are closed and a predetermined amount of operating liquid is placed inside the heat pipe 120. The evaporation and condensation of the operating liquid inside the heat pipe 120 operate to transfer heat from the heat sink 112 to the cooling structure 114. In operation, the heat from one end 134 of the heat pipe 120 (also referred herein as "heated region of the heat pipe") causes vapor to form and forces the vapor away from the heated region. The vapor travels to the other end 136 of the heat pipe 120 (also referred herein as "cooled region of the heat pipe"). The cooling structure 114 serves to dissipate the heat away from the cooled region 136 of the heat pipe, where the vapor condenses into liquid. The condensed liquid collects in the cooled region 136 of the heat pipe and capillary forces pull the fluid back to the heated region 134. This provides efficient means of dissipating heat from the heated region 134 of the heat pipe to the cooled region 136 of the heat pipe 120.

In one embodiment, the heat pipe 120 is permanently coupled to the heat sink 112 and has a 90 degree bend region 132 allowing the heat pipe 120 to pass through a mounting hole 138 formed in the circuit board 102 to the cooling structure 114. Specifically, the heat sink 112 and the heat pipe 120 are joined together before being assembled to the printed circuit board 102. This means that the shape and the length of the heat pipe 120 are selected prior to the assembling process. Accordingly, when the heat sink 112 is attached to the top of the component 104, the heat pipe 120 is configured such that one end 136 of the heat pipe can be inserted down through the thermal standoff, 118 establishing contact with the cooling structure 114. It should be noted that the thermal standoff 118 may be made of thermally conductive material so as to effectively conduct the heat from the heat pipe 120 to the cooling structure 114.

In one embodiment, one or more of the mounting holes 138 formed in the circuit board 102 are used as pathways to route heat pipes 120 down through the board. Typically, the locations of the mounting holes are standardized to common board form factors and by design are distributed across the printed circuit board for stability and system grounding. Accordingly, mounting holes are typically well dispersed across any given circuit board. Using the standard mounting holes to route a heat pipe enables a relatively short length of pipe to carry the heat from a high temperature component down through the board to a single cooling structure. By taking advantage of the standard locations of these mounting holes, thermal engineers can be provided with more options to efficiently use space available on the board for overall system thermal management.

The thermal management system 100 can be used to dissipate heat from multiple high temperature components on a printed circuit board, without significantly increasing the physical size of the device housing. Additionally, the thermal management system 100 can dissipate heat from a relatively large number of high temperature components without significantly increasing the amount of area on the circuit board that must be forfeited in order to accommodate the thermal management system. In one embodiment, each cooling subsystem, comprising a heat sink 112 and a heat pipe 120, uses only a single mounting hole provided in the circuit board to route the heat pipe from the heat sink to cooling structure. Therefore, the amount of area on the circuit board that must be forfeited for accommodating each cooling subsystem is significantly less than conventional thermal management systems utilizing retention mechanisms for securing the large and heavy heat sink and fan combinations to the circuit boards.

As noted above, circuit board mounting standoffs 116 and 118 are used to mount the circuit board 102 to the cooling structure 114 in a spaced relation. At least one of the standoffs 118 supporting the circuit board 102 is used to route the heat pipe 120, as shown in FIG. 1.

Figure 2:
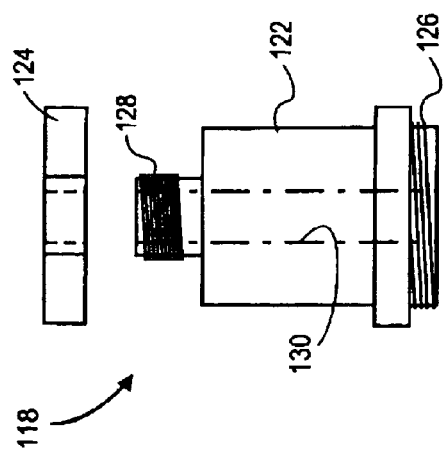
FIG. 2 is a side view illustrating a thermal standoff in accordance with one embodiment of the present invention.

FIG. 2 shows a thermal standoff 118 in accordance with one embodiment of the present invention. In the illustrated embodiment, the standoff 118 includes a spacer structure 122 having a first end 128 for mounting to a circuit board and a second end 126 for mounting to a cooling structure. The first end 128 of the spacer structure 122 comprises a threaded portion that is configured to extend through a mounting hole of a circuit board. The standoff 118 further includes a fastening member 124 to fasten the first end 128 of the spacer structure 122 to the circuit board.

Figure 3:
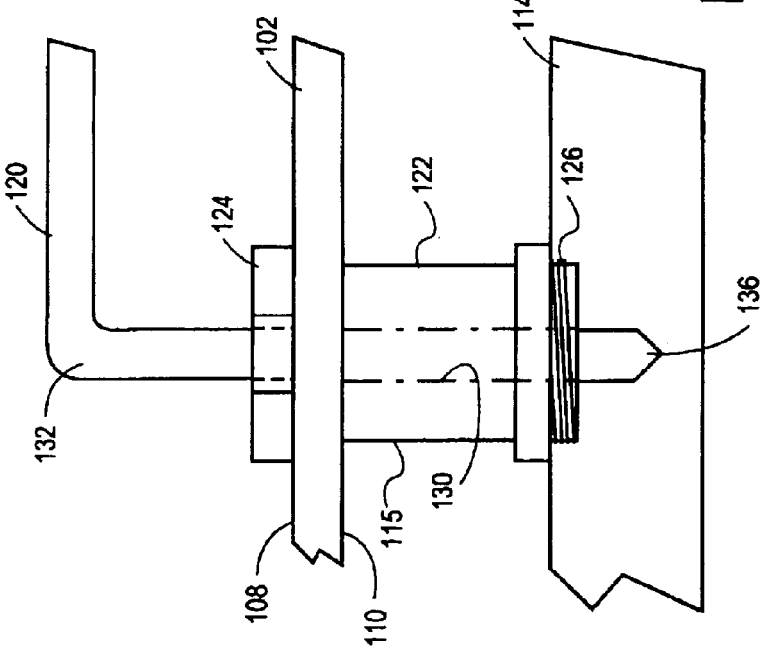
FIG. 3 is a side view illustrating a heat pipe routed through the thermal standoff shown in FIG. 2 in accordance with one embodiment of the present invention.

In accordance with one embodiment, the spacer structure 122 includes a hollow cavity 130 (also referred herein as "hollow passageway") into which a heat pipe can be inserted. In one implementation, the hollow cavity 130 extends through the entire length of the spacer structure 122 to provide a pathway through which the pipe can be routed, as shown in FIG. 3. During installation, one end 136 of the heat pipe 120 passes through the hollow passageway 130 of the standoff 118 and terminates within the cooling structure 114. By securing the standoff 118 in one of the mounting holes of the circuit board located near a high temperature component, a heat pipe having a relatively short length can be used to carry the heat from the high temperature component down through the board to the cooling structure.

In another implementation, the hollow cavity 130 extends only a portion of the length of the spacer structure 122. In this implementation, the heat pipe 120 does not make direct contact with the cooling structure 114. Instead, the standoff 118 functions as an intermediate structure that establishes thermal contact between the heat pipe 120 and the cooling structure 114.

The spacer structure 122 of the standoff serves to hold the printed circuit board 102 from the cooling structure 114 in a spaced relation. The space is provided between the printed circuit board and the cooling structure to avoid damaging the components leads on the secondary side of the printed circuit. The space between the board and the cooling structure can be adjusted by selecting an appropriate length of the spacer structure.

Referring to FIG. 2, the illustrated spacer structure 122 includes a first threaded end 128 that extends from a sleeve portion and a second threaded end 126 that is secured to the cooling structure 114. During assembling process, the circuit board 102 provided with mounting holes is secured to the first threaded end 128 of the spacer structure 122 by a fastening member 124, and are separated from the cooling by a distance equal to the length of the sleeve portion. In the illustrated embodiment, the fastening member 124 is embodied in the form of a threaded nut. However, it should be noted that other types of fastening members may be utilized to secure a spacer structure 122 to a circuit board. For example, snap-on or clip mechanisms may be utilized to facilitate attachment of the standoff 118 to a circuit board. Additionally, it should be noted that any suitable mechanism may be utilized to firmly secure the heat pipe 120 to the standoff 118 as the standoff is secured to the circuit board (e.g., as the nut is threaded), thus securing the board and the heat pipe simultaneously.

The standoffs are often used to provide system grounding by establishing an electrical connection between the circuit board and the chassis. In accordance with one embodiment, the grounding requirement can be met by the standoff 118 by making at least a portion of the standoff with electrically conductive material. Accordingly, in one embodiment, when the circuit board is resting on top of the standoff 118 and attached thereto by the nut 124, a portion of the standoff 118 will make a direct contact with a metal pad that surrounds the mounting hole, providing grounding for the circuit board down to the cooling structure 114 and/or the chassis 106.

In one embodiment, the cooling structure 114 is embodied in the form of a cooling plate attached to the secondary side 110 of the printed circuit board 102. By utilizing the secondary side of the circuit board, this permits the use of a relatively large cooling plate 114 that could be shared by multiple devices to facilitate efficient heat dissipation. Additionally, since the cooling plate 114 is located underneath the circuit board, airflow is not inhibited. In contrast, the heat sink and cooling fan combinations that are often utilized in conventional thermal management systems are relatively tall, impeding airflow to those components that are farther away from the system fan. Furthermore, it will be appreciated that the cooling plate 114 attached to the secondary side of the circuit board may function to provide additional stability and stiffness to the board.

The heat dissipation of the cooling plate 114 can be accomplished either passively or by channeling airflow from the system fan into the gap between the circuit board and the cooling structure. Since very few or no components are found on the secondary side of the board, the unobstructed airflow is more efficient than conventional primary side cooling process. In one embodiment, airflow from a system fan is channeled to dissipate the heat from the cooling plate more efficiently. In another embodiment, the heat dissipation of the cooling plate is accomplished passively and therefore circumventing the need for cooling fans.

In one implementation, at least a portion of the cooling plate 114 is in direct contact with the metal chassis 106 to facilitate further heat dissipation. In another implementation, standoffs are used to mount the cooling plate 114 in a spaced relation with respect to the chassis 106.

In an alternative embodiment, instead of using a heat pipe, liquid cooling conduits are used to provide a closed loop system in which liquid (e.g., cooling agent) is circulated between a heat sink and a cooling structure. The thermal standoffs can be used to route the liquid cooling conduits between the heat sink and the cooling structure located on the opposite sides of the board. In place of a solid cooling plate, a cooling structure having a channel can be utilized for the liquid to flow through the cooling structure for efficient heat dissipation. The conduits are then routed up through the standoffs to complete the closed loop system. Within the closed loop system, a pump may be provided to facilitate circulation of the liquid by causing the liquid to cycle through and pumped back into the heat sink. In one implementation, the liquid conduits of each closed loop system are routed through at least two standoffs. In use, the liquid flowing through a channel in the heat sink absorbs the heat generated by the electronic component that is in thermal contact with the heat sink. The heated liquid flows via a cooling conduit into one end of the cooling structure. The heat from the liquid dissipates within the cooling structure and the cooled liquid is pumped back into the heat sink via a pump mechanism.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A system comprising:
    a printed circuit board having a primary side and a secondary side;
    a heat sink coupled to an electronic component generating heat on the primary side of the printed circuit board;
    a cooling structure coupled to the secondary side of the printed circuit board; and
    a heat transfer element to transfer heat from the heat sink to the cooling structure, wherein the heat transfer element is routed through the printed circuit board via a hollow bodied standoff to establish a thermal connection between the heat sink and the cooling structure.

2. The system of claim 1, wherein the heat transfer element passes through one of mounting holes provided in the printed circuit board.

3. The system of claim 1, wherein the cooling structure is coupled to the printed circuit board via a plurality of standoffs.

4. The system of claim 3, wherein the heat transfer element is in thermal contact with one of the standoffs, and the one of the standoffs is in thermal contact with the cooling structure.

5. The system of claim 3, wherein at least one of the standoffs has a hollow cavity through which the heat transfer element is capable of being routed.

6. The system of claim 1, wherein the heat transfer element is a heat pipe in thermal contact with the cooling structure.

7. The system of claim 1, wherein the cooling structure is a cooling plate.

8. The system of claim 1, wherein the heat transfer element is a liquid conduit.

9. The system of claim 8, wherein the cooling structure includes a channel which is in fluid communication with the liquid conduit.

10. A method comprising:
    coupling a heat transfer element to a high temperature structure mounted on a primary side of a printed circuit board; and
    coupling the heat transfer element to a cooling structure location on a secondary side of the printed circuit board using at least one standoff having a hollow passageway.

11. The method of claim 10, further comprising routing the heat transfer element through a mounting hole formed in the printed circuit board.

12. The method of claim 10, wherein the heat transfer element is a heat pipe routed through the standoff having the hollow passageway.

13. The method of claim 10, wherein the heat transfer element is a liquid-filled conduit routed through the standoff having the hollow passageway.

14. The method of claim 13, further comprising:
    using liquid to absorb heat generated by the high temperature structure;
    causing the heated liquid to flow via the conduit into one end of the cooling structure;
    dissipating heat from the heated liquid within the cooling structure; and
    pumping the liquid into the high temperature structure via a pump mechanism.

15. A circuit board mounting mechanism comprising:
    a spacer structure having a first end and a second end, the first end of the spacer configured to extend through a mounting hole formed in a printed circuit board; and
    a fastening member to fasten the first end of the spacer structure to the printed circuit board, wherein the spacer structure includes a hollow cavity into which a heat transfer element is capable of being inserted.

16. The circuit board mounting mechanism of claim 15, wherein the second end of the spacer is configured to mount to a cooling structure.

17. The circuit board mounting mechanism of claim 16, wherein the spacer structure serves to establish a thermal connection between the heat transfer element and the cooling structure.

18. The circuit board mounting mechanism of claim 15, wherein the hollow cavity extends the entire length of the spacer structure to provide a pathway through which the heat transfer element is capable of being routed.

19. The circuit board mounting mechanism of claim 15, wherein the hollow cavity of the spacer structure extends a portion of the length of the spacer structure to enable the heat transfer element to pass through the entire thickness of the printed circuit board.

20. The circuit board mounting mechanism of claim 15, wherein the heat transfer element is a heat pipe to transfer heat from a high temperature structure located on one side of the printed circuit board to a cooling structure located on the other side thereof.

21. The circuit board mounting mechanism of claim 15, wherein the fastening member comprises a threaded nut to fasten to a threaded portion extending from the spacer structure.

* * * * *